(12) United States Patent
Kang et al.

(10) Patent No.: US 9,818,596 B2
(45) Date of Patent: Nov. 14, 2017

(54) ARC LAMP AND SUBSTRATE HEATING APPARATUS HAVING THE ARC LAMP

(71) Applicant: Samsung Electronics Co., Ltd., Suwon-si, Gyeonggi-do (KR)

(72) Inventors: Gon-Su Kang, Hwaseong-si (KR); Sung-Ho Kang, Hwaseong-si (KR); Min-Chul Kim, Hwaseong-si (KR); Sun-Ho Ryu, Namyangju-si (KR); Kwang-jun Lee, Hwaseong-si (KR); Yong-Hun Lee, Hwaseong-si (KR); Ju-Hong Lee, Gwangju (KR); Sun-Hong Choi, Hwaseong-si (KR); Sang-Cheol Ha, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/094,358

(22) Filed: Apr. 8, 2016

(65) Prior Publication Data

US 2017/0053791 A1 Feb. 23, 2017

(30) Foreign Application Priority Data

Aug. 18, 2015 (KR) ........................ 10-2015-0116154

(51) Int. Cl.
*H01J 61/52* (2006.01)
*H01L 21/67* (2006.01)
*H01J 61/06* (2006.01)

(52) U.S. Cl.
CPC ............ *H01J 61/526* (2013.01); *H01J 61/06* (2013.01); *H01L 21/67115* (2013.01)

(58) Field of Classification Search
CPC ....... H01J 61/073; H01J 61/06; H01J 61/0732
See application file for complete search history.

(56) References Cited

U.S. PATENT DOCUMENTS

| | | | | |
|---|---|---|---|---|
| 3,248,586 A * | 4/1966 | Schlegel | ............. | H01J 61/0732 313/335 |
| 3,636,401 A * | 1/1972 | Cortorillo | ........... | H01J 61/0732 313/352 |
| 5,168,194 A * | 12/1992 | Littlechild | .............. | H01J 61/90 313/23 |
| 5,633,556 A * | 5/1997 | Fujina | ................. | H01J 61/0732 313/30 |
| 6,593,692 B2 | 7/2003 | Kitahara et al. | | |
| 6,768,263 B2 * | 7/2004 | Aiura | .................. | G03F 7/70016 313/311 |
| 6,987,238 B2 | 1/2006 | Horner-Richardson et al. | | |

(Continued)

FOREIGN PATENT DOCUMENTS

JP 11-144677 A 5/1999
JP 5024466 B1 6/2012

(Continued)

*Primary Examiner* — Tracie Y Green
(74) *Attorney, Agent, or Firm* — Myers Bigel, P.A.

(57) ABSTRACT

An arc lamp includes an arc tube configured to receive a reaction gas therein, and an anode and a cathode disposed opposite one another within the arc tube and configured to generate an electrical arc. The anode includes an anode head portion extending inwardly from an end portion of the arc tube, and an anode tip portion bonded to the anode head portion and comprising a trench extending in a top surface along a peripheral region of the anode tip portion.

10 Claims, 8 Drawing Sheets

(56) References Cited

U.S. PATENT DOCUMENTS 7,714,522 B2     5/2010   Pekarski et al.
2007/0242457 A1*   10/2007   Okanuma ........... H01J 61/0732
                                                                     362/261

FOREIGN PATENT DOCUMENTS

| JP | 5287525 B2 | 6/2013 |
| JP | 5321427 B2 | 7/2013 |
| JP | 2013-206827 A | 10/2013 |
| JP | 5472915 B2 | 2/2014 |
| JP | 5565711 B1 | 6/2014 |

* cited by examiner

ARC LAMP AND SUBSTRATE HEATING APPARATUS HAVING THE ARC LAMP

PRIORITY STATEMENT

This application claims priority under 35 U.S.C. §119 to Korean Patent Application No. 10-2015-0116154, filed on Aug. 18, 2015 in the Korean Intellectual Property Office (KIPO), the contents of which are hereby incorporated herein by reference in its entirety.

FIELD

Example embodiments relate to an arc lamp and a substrate heating apparatus having the arc lamp. More particularly, example embodiments relate to an arc lamp used for heat-treating a wafer and a substrate heating apparatus having the same.

BACKGROUND

In manufacture of semiconductor devices, a rapid heat treatment may be performed using an arc lamp. Electrodes of the arc lamp may contact an electric arc between the electrodes, and thus, the electrodes may be consumed due to a thermal load, thereby decreasing their lifetime. Recently, as a current capacity of the arc lamp is increased greatly, the thermal load applied to the electrodes may be highly increased, thereby reducing the lifetime of the electrodes.

SUMMARY

Example embodiments provide an arc lamp having an electrode structure capable of extending the lifetime of the arc lamp.

Example embodiments provide a substrate heating apparatus including the arc lamp.

According to example embodiments, an arc lamp includes an arc tube configured to receive a reaction gas therein, and an anode and a cathode disposed opposite one another within the arc tube and configured to generate an electrical arc. The anode includes an anode head portion extending inwardly from an end portion of the arc tube, and an anode tip portion bonded to the anode head portion and comprising a trench extending in a top surface along a peripheral region of the anode tip portion.

In example embodiments, the anode head portion may include a first metal and the anode tip portion may include a second metal having a melting point greater than a melting point of the first metal.

In example embodiments, the anode head portion may have heat conductivity greater than heat conductivity of the anode tip portion.

In example embodiments, the anode tip portion may include copper and the anode tip portion may include tungsten.

In example embodiments, a middle portion in the top surface of the anode tip portion may be surrounded by the trench and may be configured to be in contact with the electric arc.

In example embodiments, the anode tip portion may further include a protruding portion protruding upwardly from the middle portion.

In example embodiments, the anode tip portion may further include a protruding portion protruding upwardly from the middle portion and having a stepwise shape.

In example embodiments, the anode may include a coolant channel for receiving a flow of a coolant liquid therethrough.

In example embodiments, the anode may include an anode body installed in the end portion of the arc tube and providing a space therein for forming a portion of the coolant channel, the anode head portion being connected to the anode body.

In example embodiments, the arc tube may include a cylindrical tube.

According to example embodiments, an arc lamp includes an arc tube configured to receive a reaction gas therein, and an anode and a cathode disposed opposite one another within the arc tube and configured to generate an electrical arc. The anode includes an anode head portion extending inwardly from an end portion of the arc tube and comprising a first metal, and an anode tip portion bonded to the anode head portion, comprising a protruding portion extending upwardly from a middle portion in a top surface of the anode tip portion, and comprising a second metal having a melting point greater than a melting point of the first metal.

In example embodiments, the anode tip portion may further include a trench extending in the top surface along a peripheral region to surround the protruding portion.

In example embodiments, the protruding portion may have a stepwise shape.

In example embodiments, the anode head portion may have heat conductivity greater than heat conductivity of the anode tip portion.

In example embodiments, the anode may include a coolant channel for receiving a flow of a coolant liquid therethrough.

According to example embodiments, a substrate heating apparatus includes a chamber providing a space configured to receive a substrate, a support plate supporting the substrate in the chamber, at least one first arc lamp disposed under the substrate and configured to heat a back side of the substrate, and at least one second arc lamp disposed over the substrate and configured to heat a front side of the substrate. At least one of the first and second arc lamps includes an arc tube configured to receive a reaction gas therein, and an anode and a cathode disposed opposite one another within the arc tube and configured to generate an electrical arc. The anode includes an anode head portion extending inwardly from an end portion of the arc tube, and an anode tip portion bonded to the anode head portion and comprising a trench extending in a top surface along a peripheral region of the anode tip portion.

In example embodiments, the chamber may include first and second windows in upper and lower portions of the chamber to selectively absorb radiation.

In example embodiments, the first arc lamp may perform ramp up heating and the second arc lamp may perform flash heating.

In example embodiments, the anode tip portion may further include a protruding portion protruding upwardly from a middle portion in the top surface of the anode tip portion.

In example embodiments, the anode tip portion may further include a protruding portion protruding upwardly from a middle portion in the top surface of the anode tip portion and having a stepwise shape.

According to example embodiments, an anode of an arc discharge lamp may include an anode head portion, and an anode tip portion on the anode head portion and comprising a trench in a top surface of the anode tip portion to extend along a peripheral region of the top surface of the anode tip portion. A middle portion in the top surface of the anode tip portion may be surrounded by the trench and may be configured to be in contact with an electric arc.

Accordingly, the electric arc may be highly concentrated on the middle portion of the anode tip portion and, a portion of only the middle portion may melt down and coagulate thereon repeatedly. Even when the molten metal flows down, the molten metal may flow into and build up within the trench. Thus, it may be prevented that a molten metal from a top portion of the anode tip portion may grow in a finger-like shape outwardly from the outermost edge portion, so that the arc may be easily generated and the lifetime of the anode may be increased.

BRIEF DESCRIPTION OF THE DRAWINGS

Example embodiments will be more clearly understood from the following detailed description taken in conjunction with the accompanying drawings.

FIG. 1 is a perspective view illustrating an arc lamp in accordance with example embodiments.

FIG. 2 is a cross-sectional view illustrating an anode of the arc lamp in FIG. 1.

FIG. 3 is an exploded perspective view illustrating a front end portion of the anode in FIG. 2.

FIG. 4 is a cross-sectional view illustrating an anode head portion and an anode tip portion of the anode in FIG. 2.

FIG. 5 is a cross-sectional view illustrating a flow of liquid along an inside surface of an arc tube of the arc lamp in FIG. 1.

FIG. 6 is a cross-sectional view illustrating an anode of an arc lamp in accordance with other example embodiments.

FIG. 7 is a cross-sectional view illustrating an anode of an arc lamp in accordance with other example embodiments.

FIG. 8 is a cross-sectional view illustrating a substrate heating apparatus in accordance with example embodiments.

FIG. 9 is a graph illustrating a temperature profile of a substrate heated by the substrate heating apparatus in FIG. 8.

DETAILED DESCRIPTION OF EXAMPLE EMBODIMENTS

Figure 1:
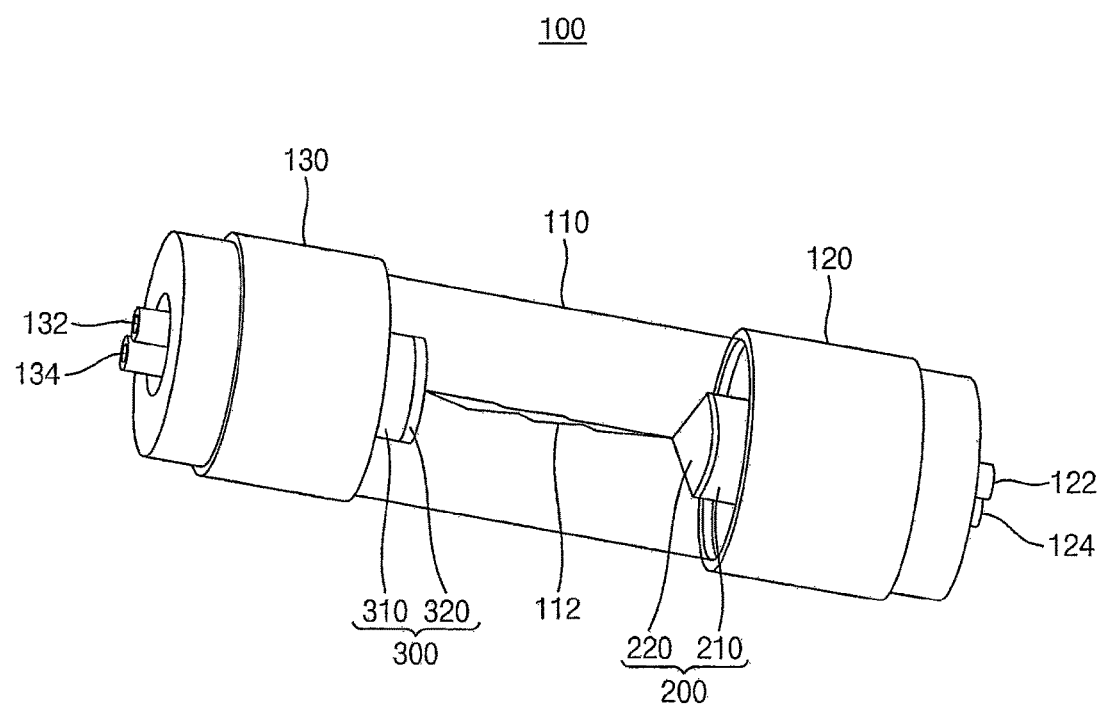
FIGS. 1 to 9 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
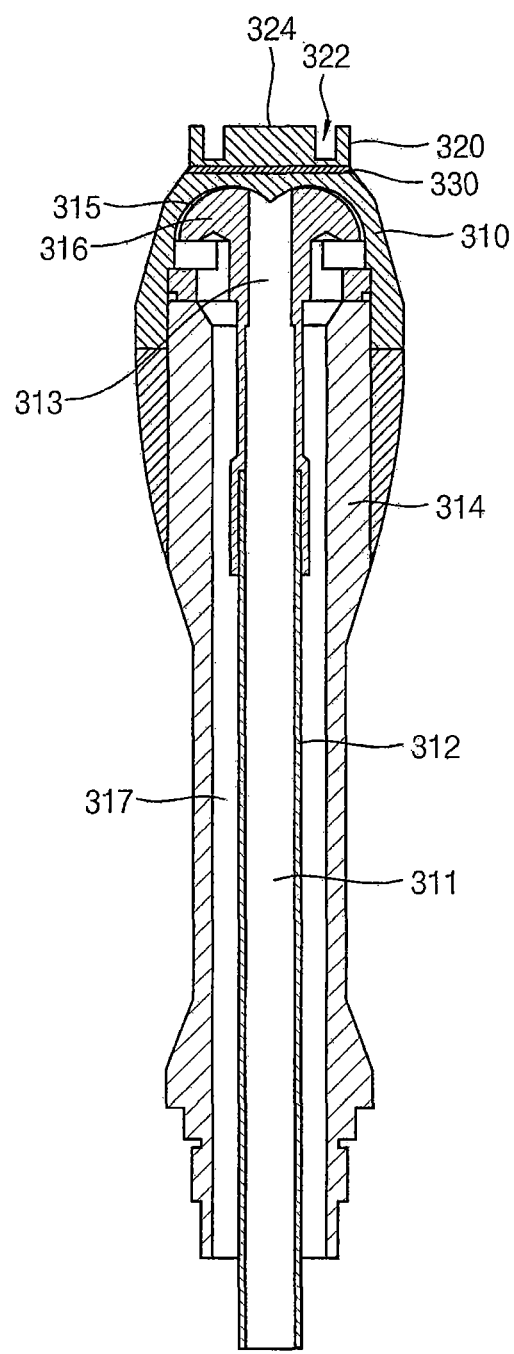
Figure 3:
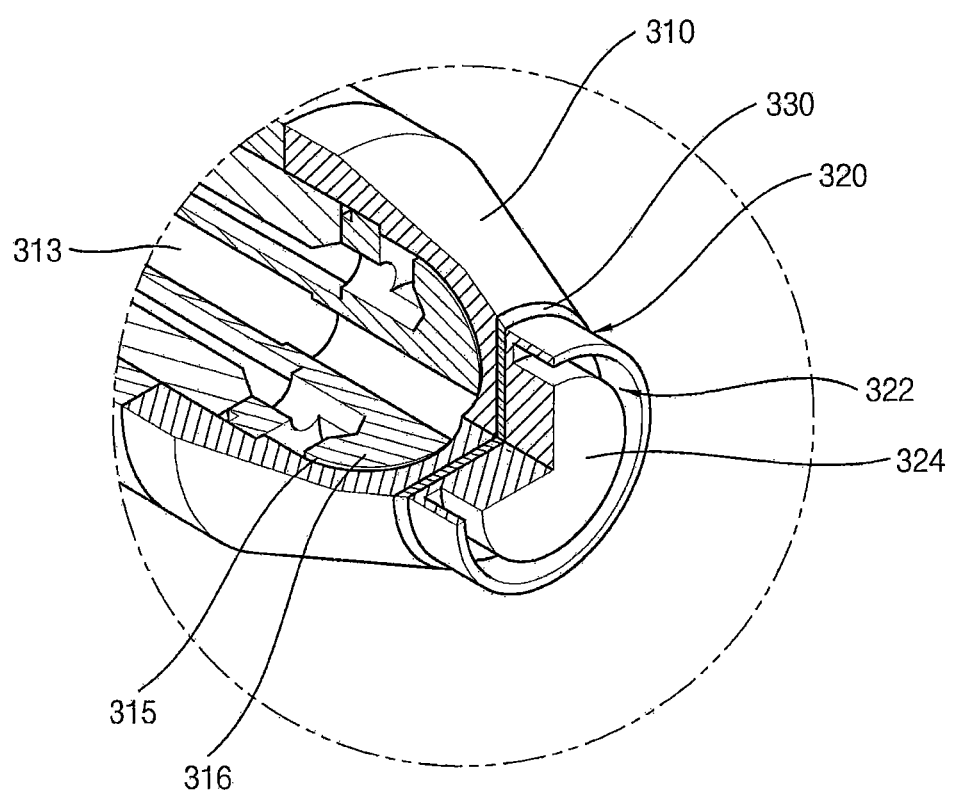
Figure 4:
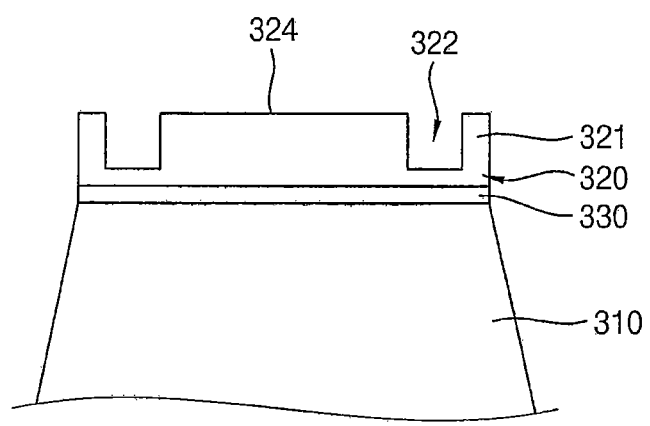
Figure 5:
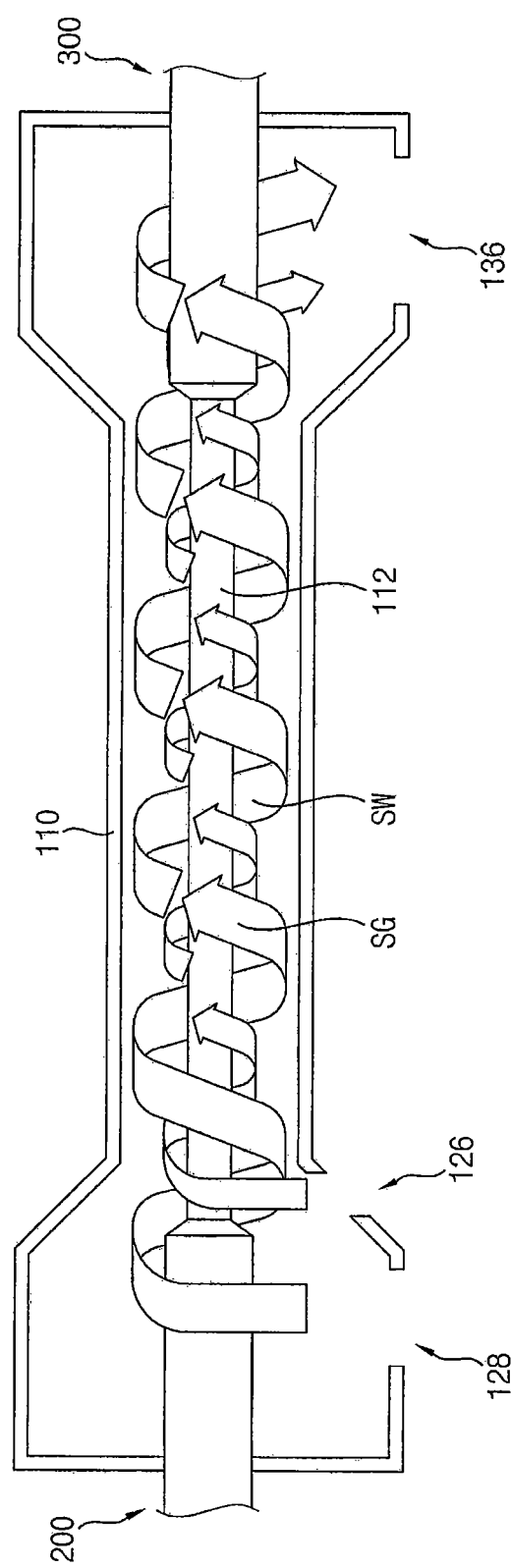

FIG. 1 is a perspective view illustrating an arc lamp in accordance with example embodiments. FIG. 2 is a cross-sectional view illustrating an anode of the arc lamp in FIG. 1. FIG. 3 is an exploded perspective view illustrating a front end portion of the anode in FIG. 2. FIG. 4 is a cross-sectional view illustrating an anode head portion and an anode tip portion of the anode in FIG. 2. FIG. 5 is a cross-sectional view illustrating a flow of liquid along an inside surface of an arc tube of the arc lamp in FIG. 1.

Referring to FIGS. 1 to 5, an arc lamp 100 may include an arc tube 110 configured to receive a reaction gas therein, and first and second electrodes, that is, a cathode 200 and an anode 300 configured to generate an electric arc 112 therebetween.

In example embodiments, the arc lamp 100 may generate the electric arc 112 between the cathode 200 and the anode 300 to produce electromagnetic radiation. The cathode 200 and the anode 300 may be electrically connected to an electrical power supply system. The electrical power supply system may include a plurality of power supply circuits electrically connected to the electrodes, that is, the cathode and the anode. The arc lamp 100 may use a power supplied from the electrical power supply system to generate the electric arc 112 between the cathode 200 and the anode 300. The arc lamp 100 may operate as a high intensity DC arc lamp for producing continuous irradiation or a flash lamp for producing an irradiance flash.

The reaction gas may be filled and sealed within the arc tube 110, and radiation spectrum may be determined depending on the type of the reaction gas. For example, the reaction gas may include Ar, Xe, etc. The arc tube 110 may include quartz. The arc tube 110 may include a cylindrical tube, however, it may not be limited thereto and the arc tube 110 may include a bulb type tube. The arc tube 110 may have various shapes according to a variety of purposes, desired output powers, etc.

A cathode housing 120 may be installed in a first end portion of the arc tube 100 and an anode housing 130 may be installed in a second end portion of the arc tube 100 opposite to the first end portion. The cathode housing 120 may fixedly support the cathode and the anode housing 130 may fixedly support the anode 300.

A first liquid inlet port 122 and a first liquid outlet port 124 may be provided in the cathode housing 120 and configured to cool the cathode 200. A second liquid inlet port 132 and a second liquid outlet port 134 may be provided in the anode housing 130 and configured to cool the anode 300. For example, the first and second liquid inlet ports 122 and 132 may be connected to coolant liquid supply lines (not illustrated) respectively, and the first and second liquid outlet ports 124 and 134 may be connected to coolant liquid return lines (not illustrated) respectively.

Accordingly, a coolant liquid may flow into an internal cooling channel of the cathode 200 through the first liquid inlet port 122 and flow out of the internal cooling channel of the cathode 200 through the first liquid outlet port 124, to cool the cathode 200. A coolant liquid may flow into an internal cooling channel of the anode 300 through the second liquid inlet port 132 and flow out of the internal cooling channel of the anode 300 through the second liquid outlet port 134, to cool the anode 300.

In example embodiments, the cathode 200 and the anode 300 may be disposed opposite one another within the arc tube 110. The cathode 200 may include a cathode head portion 210 supported by the cathode housing 120 and extending inwardly from the cathode housing 120 and a cathode tip portion 220 bonded to the cathode head portion 210. The anode 300 may include an anode head portion 310 supported by the anode housing 130 and extending inwardly from the anode housing 130 and an anode tip portion 320 bonded to the anode head portion 310. The cathode 200 may be substantially the same as or similar to the anode 300, except for a shape and a dimension of the tip portion. Hereinafter, the anode 300 will be explained in detail with reference to the accompanying drawings.

Referring to FIGS. 2 to 4, the anode 300 may include an anode body 314, the anode head portion 310, an anode pipe 312, an anode insert 316 and the anode tip portion 320. The anode body 314 may be installed in the anode housing 130, and the anode pipe 312 may be disposed within the anode body 314 and installed in the anode housing 130.

In particular, an open outer end of the anode pipe 312 may be threaded into an aperture defined through the anode housing 130. An outer end of the anode body 314 may be threaded into a wider portion of the aperture defined through the anode housing 130. The anode pipe 312 may be threadedly connected to an inner end of the anode insert 316, and the anode head portion 310 may be disposed on the anode body 314. The anode head portion 310 may be threadedly connected to the anode body 314. The anode body 314 and the anode head portion 310 may surround the anode pipe 312 and the anode insert 316. The anode tip portion 320 may be mounted on the anode head portion 310. The anode pipe 312, the anode body 314, the anode insert 316 and the anode head portion 310 may be connected to each other by other suitable methods, such as brazing, welding, etc.

The anode 300 may include a coolant channel 311, 313, 315 and 317 for receiving a flow of a coolant liquid therethrough. In particular, the coolant liquid may be directed to the coolant channel by the second liquid inlet port 132 provided in the anode housing 130, and enter a channel 311 of the anode pipe 312 and then a channel 313 defined through the anode insert 316. Then, the coolant liquid may enter a channel 315 defined between the anode insert 316 and the anode head portion 310 and then a channel 317 defined between an outer surface of the anode pipe 312 and an inner surface of the anode body 314, and then the coolant liquid may be exhausted through the second liquid outlet port 134. Thus, as the coolant liquid travels through the coolant channel, the coolant channel may remove heat from the anode head portion 310 and hence indirectly from the anode tip portion 320.

The anode head portion 310 may include a first metal, and the anode tip portion 320 may include a second metal having a melting point greater than a melting point of the first metal. The anode head portion 310 may have heat conductivity greater than heat conductivity of the anode tip portion 320. Because the anode tip portion 320 contacts the electric arc 112, the anode tip portion 320 may include a metal having a relatively high melting point in order to endure high temperature. The anode head portion 310 may include a metal having a relatively high heat conductivity in order to transfer rapidly heat from the anode tip portion 320. Other components may include a metal having high mechanical strength. For example, the anode head portion 310 may include copper, and the anode tip portion 320 may include tungsten. The anode body 314, the anode pipe 312 and the anode insert 316 may include brass.

In example embodiments, the anode tip portion 320 may include a trench 322 which is formed in a top surface to extend along a peripheral region of the top surface of the anode tip portion 320. The trench 322 may extend in a circumference direction to surround the middle region of the anode tip portion 320. A barrier 321 may be provided in an outer-most peripheral region of the anode tip portion 320 to define a sidewall of the trench 322. A middle portion 324 in the top surface of the anode tip portion 320 may be surrounded by the trench 322 and may be configured to be in contact with the electric arc 112. The trench 322 may have a ring shape surrounding the middle portion 324.

The middle portion 324 of the anode tip portion 320 may have a relatively great thickness in order to provide an increase in the lifetime compared to a conventional electrode. For example, the middle portion 324 of the anode tip portion 320 may have a thickness of at least 1 cm. The thickness of the middle portion 324 of the anode tip portion 320 may be substantially the same as or greater than a thickness of the barrier 321.

Accordingly, the electric arc may be highly concentrated on the middle portion 324 of the anode tip portion 320 and, due to a thermal load, a portion of only the middle portion may melt down and coagulate thereon repeatedly. Even when the molten metal flows down, the molten metal may flow into and build up within the trench 322. Thus, it may be prevented that a molten metal from a top portion of the anode tip portion 320 may grow in a finger-like shape outwardly from the outermost edge portion, so that the arc may be easily generated and the lifetime of the anode may be increased.

In example embodiments, the anode 300 may include a diffusion interlayer 330 between the anode head portion 310 and the anode tip portion 320. The diffusion interlayer 330 may be an organically bound layer of the first metal and the second metal. The anode tip portion 320 may be bonded to the anode head portion 310 by solid state diffusion bonding. Pressure and heat may be applied to the two metals, very little plastic deformation occurs, and the two metals may begin to diffuse across the boundary of the abutting surfaces to form the diffusion interlayer 330, creating the bond. Accordingly, the diffusion bonding may involve no liquid fusion to prevent a void from being generated, so that a heat transfer from the anode tip portion 320 to the anode head portion 310 may be improved, and the lifetime of the arc discharge lamp 100 may be increased.

As illustrated in FIG. 5, in example embodiments, the arc lamp 100 may further include a flow generator configured to generate a flow of fluid along an inside surface of the arc tube 110. The flow generator may be provided in the cathode housing 120, and may generate flows of gas and liquid supplied from a gas inlet port 126 and a liquid inlet port 128 in the cathode housing 120 respectively along the inside surface of the arc tube 110. The flow generator may generate spiraling flows (SG and SW) of gas and liquid along the inside surface of the arc tube 110. The gas may include argon, and the liquid may include a deionized water.

As the gas and the liquid traverse the arc tube 110 in an axial direction toward the anode 300, the spiraling gas and liquid SG and SW may circle around the inside surface of the arc tube 110 in the same rotation direction. The liquid and the gas may be exhausted through gas/liquid outlet port 136 and returned to a fluid recirculation system (not illustrated). Thus, the spiraling flows of the liquid and gas along the inside surface of the arc tube 110 may reduce thermal gradients in the arc tube 110 and exhaust impurities from the arc tube 110, thereby increasing the lifetime of the arc lamp and allowing a thicker tube to be used as the arc tube 110.

Figure 6:
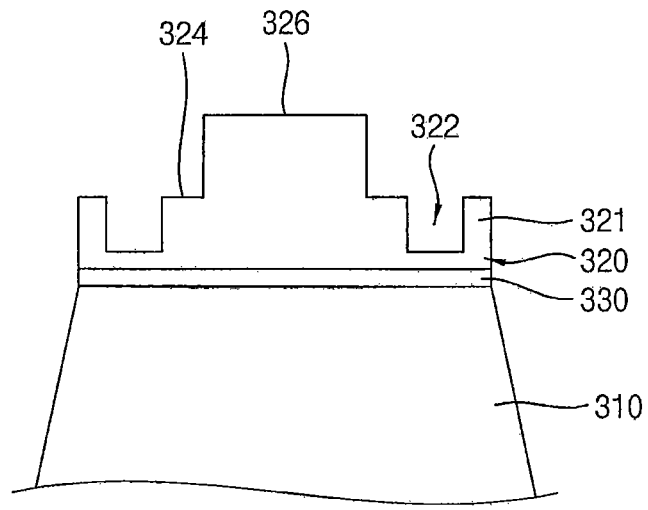

FIG. 6 is a cross-sectional view illustrating an anode of an arc lamp in accordance with other example embodiments. The arc lamp may be substantially the same as or similar to that illustrated with reference to FIGS. 1 to 4, except for the shape of the anode tip portion. Thus, same reference numerals will be used to refer to the same or like elements, and any further repetitive explanation concerning the above elements will be omitted.

Referring to FIG. 6, an anode of an arc discharge lamp may include an anode head portion 310 and an anode tip portion 320 bonded to the anode head portion 310. A trench 322 may be formed in a top surface of the anode tip portion 320 to extend along a peripheral region of the top surface of the anode tip portion 320. The trench 322 may extend in a circumference direction to surround a middle portion 324 of the anode tip portion 320. A barrier 321 may be provided in an outer-most peripheral region of the anode tip portion 320 to define a sidewall of the trench 322.

In example embodiments, the anode tip portion 320 may further include a protruding portion 326 protruding upwardly from the middle portion 324 in the top surface of the anode tip portion 320. The protruding portion 326 of the anode tip portion 326 may be surrounded by the trench 322 and may be configured to be in contact with the electric arc 112. A thickness of the protruding portion 326 of the anode tip portion 320 may be greater than a thickness of the barrier 321. A top surface of the protruding portion 326 may be higher than a top surface of the barrier 321. A diameter of the protruding portion 326 may be less than a diameter of the middle portion 324.

The electric arc may be highly concentrated on the protruding portion 326 of the anode tip portion 320 and, a portion of only the protruding portion 326 may melt down and coagulate thereon repeatedly. Even when the molten metal flows down, the molten metal may flow into and build up within the trench 322. Thus, the electric arc may be easily generated and the lifetime of the anode may be increased.

Figure 7:
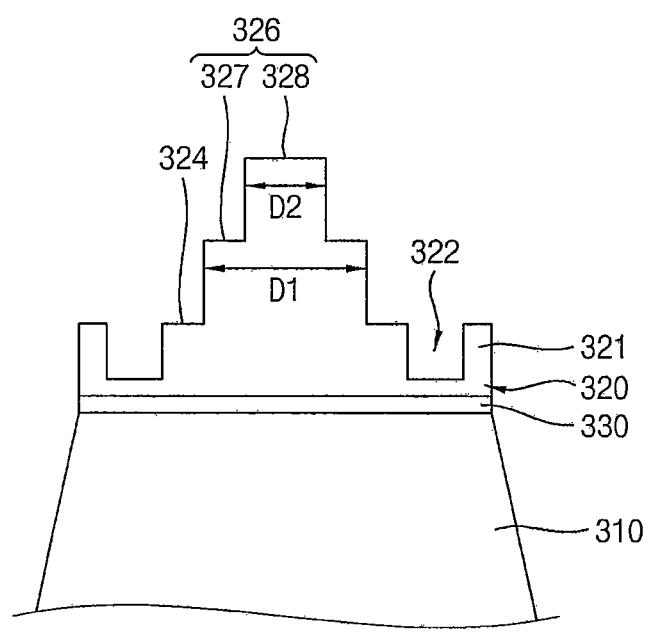

FIG. 7 is a cross-sectional view illustrating an anode of an arc lamp in accordance with other example embodiments. The arc lamp may be substantially the same as or similar to that illustrated with reference to FIGS. 1 to 4, except for the shape of the anode tip portion. Thus, same reference numerals will be used to refer to the same or like elements, and any further repetitive explanation concerning the above elements will be omitted.

Referring to FIG. 7, an anode of an arc discharge lamp may include an anode head portion 310 and an anode tip portion 320 bonded to the anode head portion 310. A trench 322 may be formed in a top surface of the anode tip portion 320 to extend along a peripheral region of the top surface of the anode tip portion 320. The trench 322 may extend in a circumference direction to surround a middle portion 324 of the anode tip portion 320. A barrier 321 may be provided in an outer-most peripheral region of the anode tip portion 320 to define a sidewall of the trench 322.

In example embodiments, the anode tip portion 320 may further include a protruding portion 326 protruding upwardly from the middle portion 324 in the top surface of the anode tip portion 320 and having a stepwise shape. The protruding portion 326 may include a plurality of steps having at least a first step 327 and a second step 328. A diameter D1 of the first step 327 may be greater than a diameter D2 of the second step 328.

An electric arc may be highly concentrated on the protruding portion 326 of the anode tip portion 320 and, the plurality of steps of only the stepwise protruding portion 326 may melt down sequentially and coagulate thereon repeatedly. Thus, the arc may be easily generated and the lifetime of the anode may be increased.

Hereinafter, a substrate heating apparatus including the arc lamp in FIG. 1 will be explained.

Figure 8:
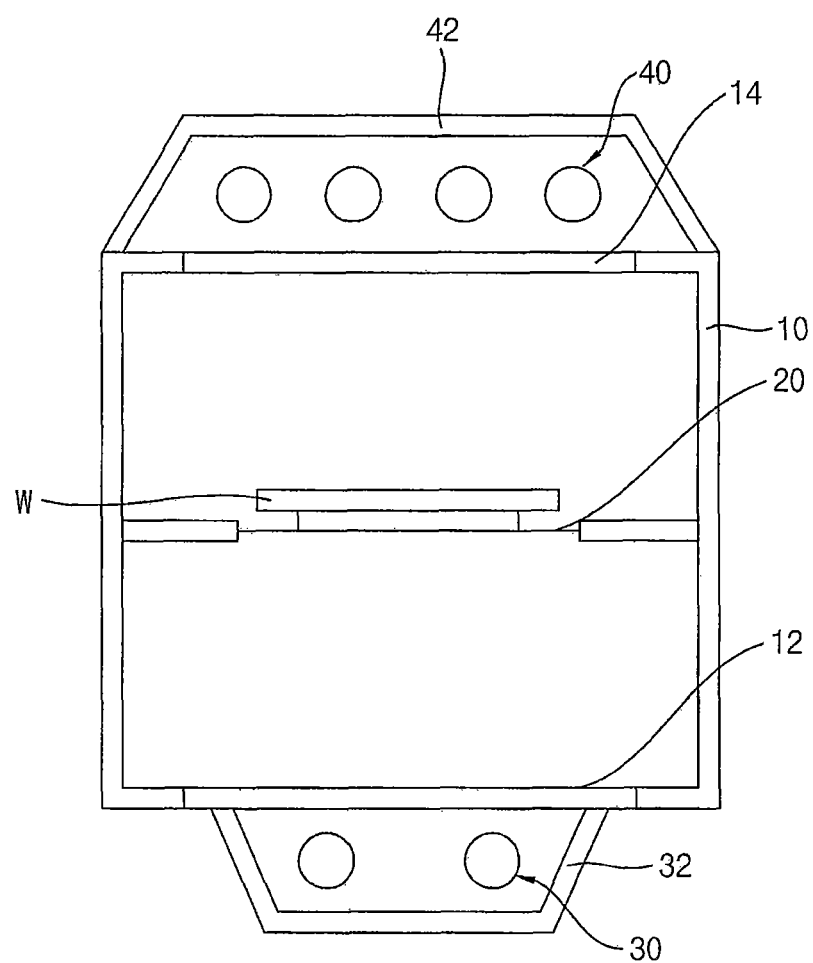
Figure 9:
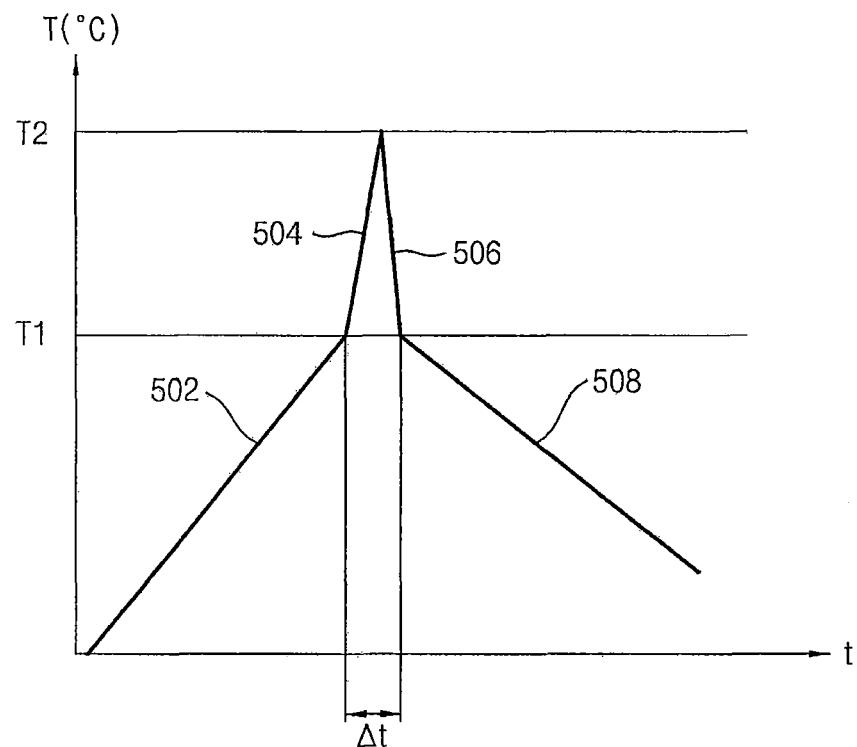

FIG. 8 is a cross-sectional view illustrating a substrate heating apparatus in accordance with example embodiments. FIG. 9 is a graph illustrating a temperature profile of a substrate heated by the substrate heating apparatus in FIG. 8.

Referring to FIGS. 8 and 9, a substrate heating apparatus may include a chamber 10 providing a space configured to receive a substrate, a support plate 20 supporting the substrate in the chamber 10, at least one first arc lamp 30 disposed under the substrate and configured to heat a back side of the substrate, and at least one second arc lamp 40 disposed over the substrate and configured to heat a front side of the substrate.

In example embodiments, the substrate may include a semiconductor wafer W. For example, the wafer W may be a silicon semiconductor wafer of 300 mm in diameter used for manufacturing of semiconductor chips. The front side of the substrate may include an upper surface or an active surface of the wafer W, and the back side of the substrate may include a backside of the wafer W.

Before loading the wafer W into the substrate heating apparatus, an ion implantation process may be performed on a device side surface (active surface) of the wafer W to dope impurities or dopants into the device side surface. The ion implantation process may damage crystal lattice structures in the surface region of the wafer W. In order to recover the surface damages by the ion implantation process, the damaged surface region of the wafer W may be annealed by a heat treatment using the substrate heating apparatus.

The chamber 10 may include first and second windows 12 and 14 in upper and lower portions of the chamber 10 to selectively absorb radiation. The chamber 10 may include specular walls. The wafer W may be supported on the support plate 20 in the chamber 10. The wafer W may be supported on a quartz window by a plurality of support pins.

The substrate heating apparatus may include a first heating portion configured to heat the back side of the wafer W. The first heating portion may include at least one first arc lamp 30 and a first reflector 32 under the first window 12. The first heating portion may include two first arc lamps 30. The first arc lamp 30 may operate as a high-intensity DC arc lamp for continuous irradiance.

The substrate heating apparatus may include a second heating portion configured to heat the front side of the wafer W. The second heating portion may include at least one second arc lamp 40 and a second reflector 42 over the second window 14. The second heating portion may include four second arc lamps 40. The second arc lamp 40 may operate as a flash lamp for irradiance flash.

In example embodiments, the first arc lamp 30 may perform ramp up heating on the wafer W and the second arc lamp 40 may perform flash heating on the upper surface of the wafer W which is heated by the ramp up heating.

As illustrated in FIG. 9, after the wafer W is loaded on the support plate 20, the ramp up heating may be performed by the first arc lamp 30. Thus, the wafer W may be pre-heated to an intermediate temperature T1. Then, the flash heating may be performed by the second arc lamp 40. Thus, the wafer w may be heated to a final annealing temperature T2. Then, the flash heating by the second arc lamp 40 may discontinue to induce rapid cooling by thermal conduction from the upper surface of the wafer W to a wafer bulk, and then, the heating by the first arc lamp 30 may discontinue to induce ramp down cooling by thermal radiation to the wafer bulk.

In the initial pre-heating stage 502, the ramp up heating may occur at a rate significantly slower than a thermal conduction time through the wafer W. In the subsequent flash heating stage 504, the flash heating may occur much more rapidly than the thermal conduction time through the wafer W, so that only the device side surface of the wafer W may be heated to the final annealing temperature T2, while the bulk of the wafer W may remain close to the cooler intermediate temperature T1. Such surface heating may be achieved by exposing the surface of the wafer to a high-power irradiance flash having a relatively short duration ($\Delta t$), such as one millisecond, for example.

As such, through the flash heating by the second arc lamp 40, a heat treatment may performed rapidly on the surface of the wafer W. In here, the bulk of the wafer W may remain to a relatively low temperature. Accordingly, the dopants implanted into the surface of the wafer W may be activated, while the increase in temperature of the bulk of the wafer W may be suppressed to prevent the dopants from diffusing into the bulk of the wafer.

In example embodiments, the first arc lamp 30 or the second arc lamp 40 may be the arc lamp in FIG. 1. The first arc lamp 30 may operate for a relatively longer duration than the second arc lamp 40. The first arc lamp 30 may be a high-intensity DC arc lamp. Accordingly, an anode of the first arc lamp 30 may be designed to withstand a thermal load of fairly large size applied thereto.

As mentioned above, an anode tip portion 320 of the arc lamp may include a trench 322 which is formed in a top surface to extend along a peripheral region of the top surface of the anode tip portion 320. A middle portion 324 in the top surface of the anode tip portion 320 may be surrounded by the trench 322 and may be configured to be in contact with the electric arc 112.

Accordingly, the electric arc may be highly concentrated on the middle portion of the anode tip portion 320 and, a portion of only the middle portion may melt down and coagulate thereon repeatedly. Even when the molten metal flows down, the molten metal may flow into and build up within the trench 322. Thus, it may be prevented that a molten metal from a top portion of the anode tip portion 320 may grow in a finger-like shape outwardly from the outermost edge portion, so that the arc may be easily generated and the lifetime of the anode may be increased.

The arc lamp and the substrate heating apparatus having the arc lamp in accordance with example embodiments may be used for a rapid annealing process. The rapid annealing process may be applied for activation of dopants, silicon defect curing or metal silicidation, oxidation, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. An arc lamp, comprising:
   an arc tube configured to receive a reaction gas therein; and
   an anode and a cathode disposed opposite one another within the arc tube and configured to generate an electric arc,
   the anode comprising:
     an anode head portion extending inwardly from an end portion of the arc tube; and
     an anode tip portion bonded to the anode head portion, wherein the anode tip portion comprises a top surface, and wherein a trench is formed in the top surface and extends along a peripheral region of the top surface.

2. The arc lamp of claim 1, wherein the anode head portion comprises a first metal and the anode tip portion comprises a second metal having a melting point greater than a melting point of the first metal.

3. The arc lamp of claim 2, wherein the anode head portion has heat conductivity greater than heat conductivity of the anode tip portion.

4. The arc lamp of claim 2, wherein the anode head portion comprises copper and the anode tip portion comprises tungsten.

5. The arc lamp of claim 1, wherein a middle portion in the top surface of the anode tip portion is surrounded by the trench and is configured to be in contact with the electric arc.

6. The arc lamp of claim 5, wherein the anode tip portion further comprises a protruding portion protruding upwardly from the middle portion.

7. The arc lamp of claim 5, wherein the anode tip portion further comprises a protruding portion protruding upwardly from the middle portion and having a stepwise shape.

8. An arc lamp, comprising:
- an arc tube configured to receive a reaction gas therein; and
- an anode and a cathode disposed opposite one another within the arc tube and configured to generate an electric arc,
- the anode comprising:
  - an anode head portion extending inwardly from an end portion of the arc tube;
  - an anode tip portion bonded to the anode head portion, wherein the anode tip portion comprises a top surface, and wherein a trench extends around the top surface in a peripheral region of the anode tip portion; and
  - a coolant channel for receiving a flow of a coolant liquid therethrough.

9. The arc lamp of claim 8, wherein the anode comprises an anode body installed in the end portion of the arc tube and providing a space therein for forming a portion of the coolant channel, the anode head portion being connected to the anode body.

10. The arc lamp of claim 1, wherein the arc tube comprises a cylindrical tube.

* * * * *